United States Patent
New et al.

(10) Patent No.: US 8,470,614 B2
(45) Date of Patent: Jun. 25, 2013

(54) PECVD SHOWERHEAD CONFIGURATION FOR CMP UNIFORMITY AND IMPROVED STRESS

(75) Inventors: Jason James New, St. Paul, TX (US); Salvatore Frank Pavone, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 21 days.

(21) Appl. No.: 13/284,624

(22) Filed: Oct. 28, 2011

(65) Prior Publication Data

US 2012/0108066 A1    May 3, 2012

Related U.S. Application Data (60) Provisional application No. 61/407,814, filed on Oct. 28, 2010.

(51) Int. Cl.
*H01L 21/66* (2006.01)
(52) U.S. Cl.
USPC ................................. 438/14; 257/E21.529

(58) Field of Classification Search
USPC ................................. 438/14; 257/E21.529
See application file for complete search history.

(56) References Cited

U.S. PATENT DOCUMENTS 7,481,886 B2 * 1/2009 Kato et al. ............ 118/715

* cited by examiner

*Primary Examiner* — Tony Tran
(74) *Attorney, Agent, or Firm* — Wade J. Brady, III; Frederick J. Telecky, Jr.

(57) ABSTRACT

A dielectric deposition tool for forming a silicon dioxide layer on a wafer with a TEOS showerhead which delivers a flow rate per unit area from an edge band of the showerhead that is at least twice a flow rate per unit area from a central region of the showerhead. The edge band extends at least one half inch from an outer edge of the showerhead up to one fourth of the diameter of the wafer. A process of forming an integrated circuit by forming a silicon dioxide layer on a wafer containing the integrated circuit using the dielectric deposition tool. The silicon dioxide layer is thicker under the edge band than under the central region. A subsequent CMP operation reduces the thickness difference between the wafer outer annulus and the wafer core by at least half. The silicon dioxide layer has a compressive stress between 125 and 225 MPa.

10 Claims, 6 Drawing Sheets

PECVD SHOWERHEAD CONFIGURATION FOR CMP UNIFORMITY AND IMPROVED STRESS

This application claims the benefit of U.S. Provisional Application No. 61/407,814, filed Oct. 28, 2010, the entirety of which is herein incorporated by reference.

FIELD OF THE INVENTION

This invention relates to the field of integrated circuits. More particularly, this invention relates to formation of thin films in integrated circuits.

BACKGROUND OF THE INVENTION

An integrated circuit may contain a layer of silicon dioxide, for example an inter-level dielectric (ILD) layer between levels of metal interconnects. It may be desirable to planarize the ILD layer, for example using a chemical-mechanical polish (CMP) process. It may be further desirable to form the dielectric layer so as to have a compressive stress in a desired range.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing a silicon dioxide layer may be formed by flowing tetraethylorthosilicate, also known as TEOS, in a vapor phase through a TEOS delivery showerhead which provides an average flow rate per unit area in an edge band of the showerhead which is at least twice an average flow rate in a central region of the showerhead. The edge band is at least one half inch wide and up to one fourth of the diameter of the wafer containing the integrated circuit. The thickness profile of the silicon dioxide layer after deposition is thicker at the edge of the wafer, so as to compensate for a higher material removal rate during a subsequent CMP planarization process. The higher flow rate of TEOS at the edge of the wafer further provides a compressive stress in the silicon dioxide layer between 125 and 225 megapascals (MPa).

DETAILED DESCRIPTION OF EXAMPLE EMBODIMENTS

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing a silicon dioxide layer may be formed by decomposition of TEOS on a surface of the semiconductor wafer containing the integrated circuit. The TEOS is delivered to the wafer in vapor phase from a TEOS delivery showerhead apparatus which is part of a dielectric deposition tool. The showerhead is configured to provide an average flow rate per unit area at an edge band of the showerhead which is at least twice an average flow rate in the central region of the showerhead. The edge band is at least one half inch wide and up to one fourth of the diameter of the wafer containing the integrated circuit. The thickness profile of the silicon dioxide layer after deposition is thicker at the edge of the wafer, so as to compensate for a higher material removal rate during a subsequent CMP planarization process. The higher flow rate of TEOS at the edge of the wafer further provides a compressive stress in the silicon dioxide layer between 125 and 225 megapascals (MPa).

For the purposes of this description, the term "substantially" as applied to structures and elements formed in an integrated circuit is understood to mean within fabrication tolerances used in the instant embodiment. For example, elements described as substantially equal are understood to be equal within fabrication tolerances used to form the elements. Similarly, elements described are substantially circular are circular within fabrication tolerances used to shape the elements.

The term "wafer" is understood to include any layers on the wafer, for example, dielectric layers such as field oxide and a pre-metal dielectric (PMD) layer, as well as electrically conductive elements such as gates, contacts, interconnects, and vias. The term "wafer" also includes any layers being formed on the wafer or being modified, for example planarized, on the wafer.

Figure 1A:
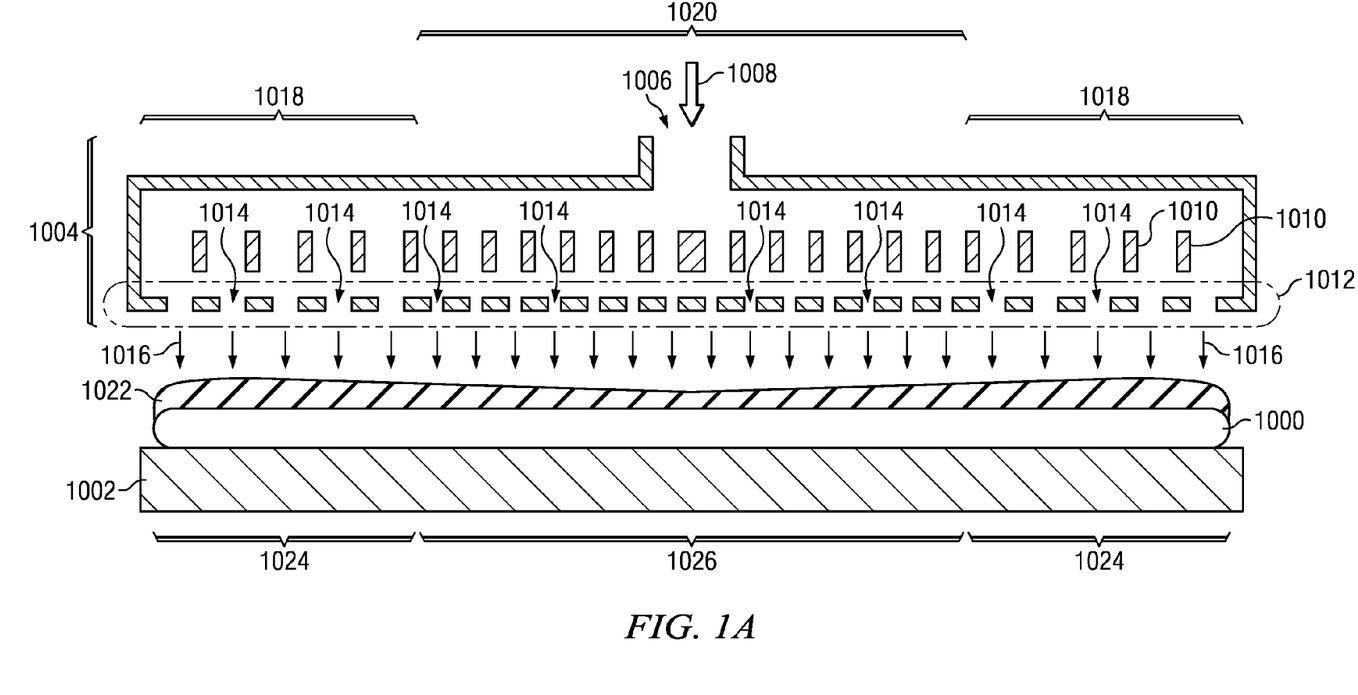
FIG. 1A through FIG. 1C are cross sections depicting formation of a silicon dioxide on a semiconductor wafer containing an integrated circuit, according to an embodiment.
Figure 1B:
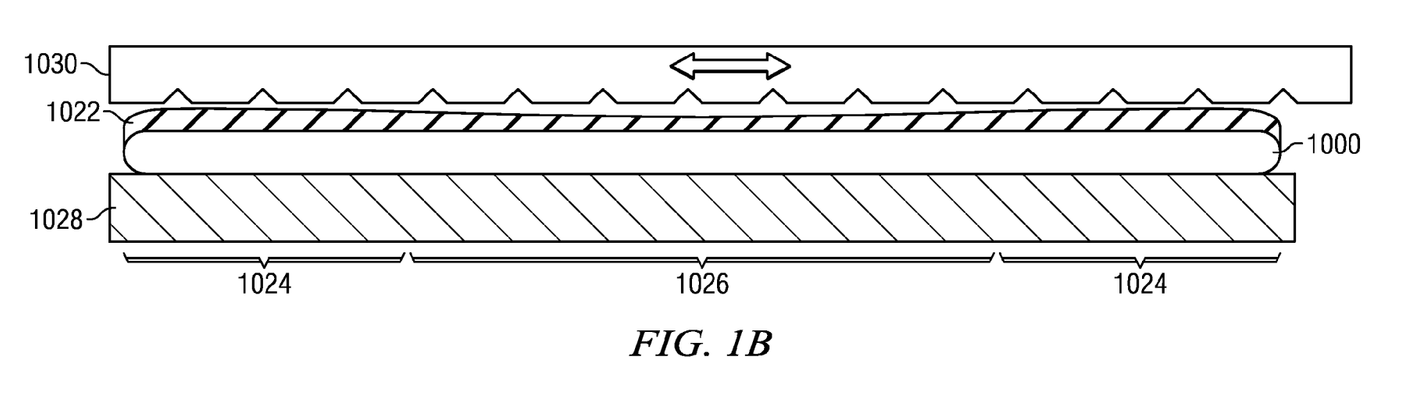
Figure 1C:
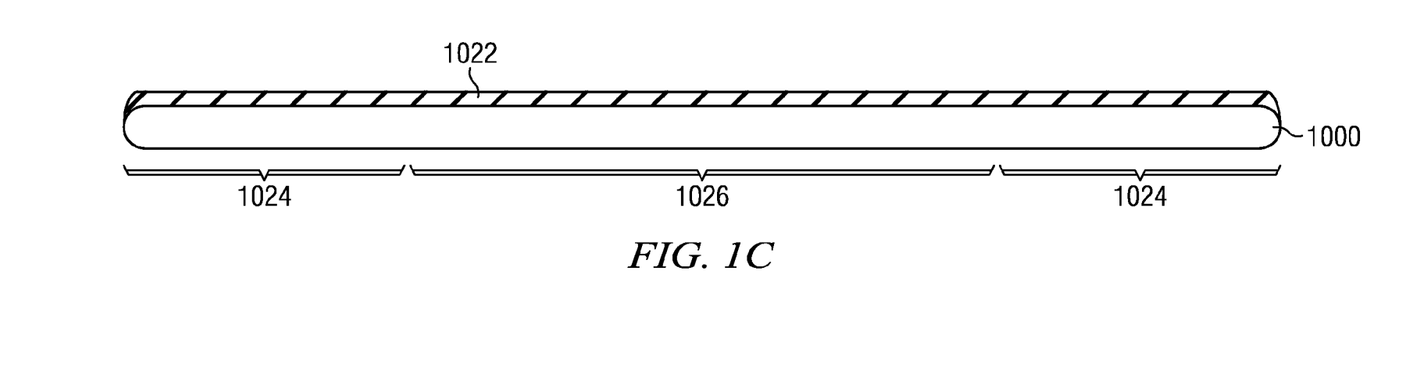

FIG. 1A through FIG. 1C are cross sections depicting formation of silicon dioxide on a semiconductor wafer containing an integrated circuit, according to an embodiment. Referring to FIG. 1A, the wafer 1000 is positioned in a dielectric deposition tool on a deposition wafer chuck 1002 which supports the wafer 1000 during a silicon dioxide deposition process, and may maintain the wafer 1000 at a desired temperature. A TEOS delivery showerhead 1004 is located above the wafer 1000, for example so that a bottom of the showerhead 1004 is between one fourth of an inch and one inch above a top surface of the wafer 1000. TEOS gas enters the showerhead 1004 through an input port 1006, depicted schematically in FIG. 1A by a TEOS input flow arrow 1008. TEOS is commonly stored in liquid phase, and delivered to the dielectric deposition tool as a liquid. The TEOS is converted to vapor phase, for example by flowing through a heated tube, before flowing into the showerhead 1004. The TEOS gas is commonly mixed with a carrier gas such as nitrogen. TEOS flow rates are specified in cubic centimeters per minute in the liquid phase. In one version of the instant embodiment in which the wafer 1000 is a 200 mm wafer, TEOS gas may enter the showerhead 1004 at a flow rate between 2.1 and 3.2 cubic centimeters per minute. Other deposition process parameters, such as wafer temperature and RF power, may be provided by similar process operations using a conventional showerhead. An interior region of the showerhead 1004 connected to the input port 1006, which may contain diffuser baffles 1010, distributes the TEOS gas through the showerhead 1004. A bottom plate 1012 of the showerhead 1004 abutting the interior region has TEOS delivery apertures 1014 through which the TEOS gas flows onto the top surface of the wafer 1000, depicted schematically in FIG. 1A by TEOS output flow arrows 1016. The TEOS delivery apertures 1014 are configured so as to provide an average flow rate per unit area of TEOS gas from an edge band 1018 of the showerhead 1004 which is at least twice an average flow rate per unit area of TEOS gas from a central region 1020 of the showerhead 1004. The edge band extends from an outer edge of the bottom plate 1012 at least one half an inch and up to one fourth of a diameter of the wafer 1000. For example, a showerhead for a 200 mm wafer may have an edge band between one half an inch and 50 mm, which is approximately 1.97 inches. Similarly, a showerhead for a 300 mm wafer may have an edge band between one half an inch and 75 mm, which is approximately 2.95 inches.

A layer of silicon dioxide 1022 is formed on the top surface of the wafer 1000 by decomposition of the TEOS gas. The silicon dioxide layer 1022 is thicker in a wafer outer annulus 1024 under the edge band 1018 than in a wafer core 1026 under the central region 1020. As a result of the increased TEOS flow rate from the edge band 1018, the silicon dioxide layer 1022 has a compressive stress between 125 and 225 MPa. In one version of the instant embodiment, after formation of the silicon dioxide layer 1022 is completed, an average thickness of the silicon dioxide layer 1022 in the wafer outer annulus 1024 is between 3 and 5 percent more than an average thickness of the silicon dioxide layer 1022 in the wafer core 1026.

FIG. 1B depicts a subsequent CMP operation in which the silicon dioxide layer 1022 is planarized. The wafer 1000 is positioned on a CMP wafer chuck 1028. CMP slurry, not shown, is dispensed on a top surface of the silicon dioxide layer 1022. The CMP slurry contains abrasive particles and chemicals which remove silicon dioxide. A CMP pad 1030 is applied to the wafer 1000 with a translating and rotating motion and a programmed force, so that silicon dioxide is removed from the top surface of the silicon dioxide layer 1022. In the instant embodiment, the CMP process removes more material in the wafer outer annulus 1024 than in the wafer core 1026. The configuration of TEOS delivery apertures 1014 in the showerhead 1004 are configured so that a thickness of the silicon dioxide layer 1022 in the wafer outer annulus 1024 and a thickness of the silicon dioxide layer 1022 in the wafer core 1026 are sufficient to compensate for the higher material removal rate of the CMP process in the wafer outer annulus 1024.

FIG. 1C depicts the wafer 1000 after completion of the CMP process. The silicon dioxide layer 1022 has a thickness profile such that a thickness difference between an average thickness in the wafer outer annulus 1024 and an average thickness in the wafer core 1026 on the wafer 1000 after completion of the CMP process is less than half a corresponding thickness difference on the wafer 1000 after formation of the silicon dioxide layer 1022 and before the CMP process. The silicon dioxide layer 1022 has a compressive stress between 125 and 225 MPa.

Figure 2:
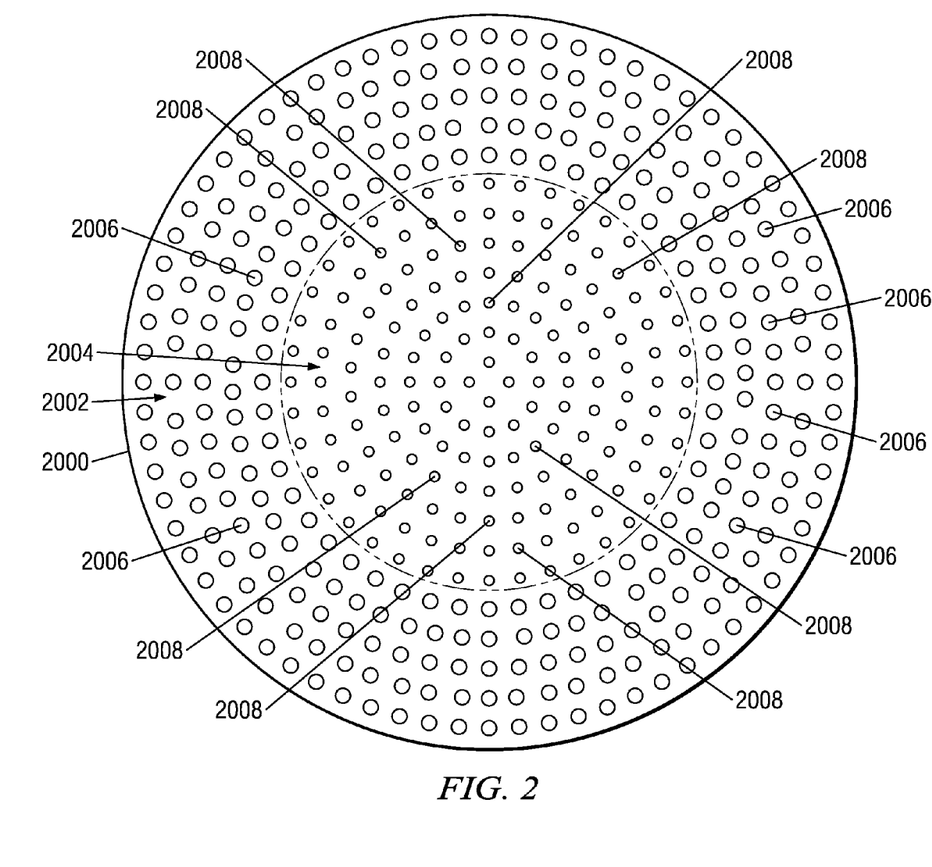
FIG. 2 is a plan view of a TEOS delivery showerhead formed according to an embodiment.

FIG. 2 is a plan view of a TEOS delivery showerhead formed according to an embodiment. The showerhead is used to deliver TEOS gas to a wafer, as described in reference to FIG. 1A. The TEOS delivery showerhead 2000 has an edge band 2002 which is at least one half inch wide and up to one fourth of the diameter of the wafer, and a central region 2004 which extends from a center of the showerhead 2000 to the edge band 2002. The showerhead 2000 includes a set of edge TEOS delivery apertures 2006 in the edge band 2002, and a set of central TEOS delivery apertures 2008 in the central region 2004. In the instant embodiment, an area density of the edge TEOS delivery apertures 2006, calculated by dividing a total number of edge TEOS delivery apertures 2006 by an area of the edge band 2002, and expressed for example in holes per square centimeter, is substantially equal to an area density of the central TEOS delivery apertures 2008. In the instant embodiment, the edge TEOS delivery apertures 2006 are substantially circular and substantially equal in size to each other, and the central TEOS delivery apertures 2008 are substantially circular and substantially equal in size to each other, and an average diameter of the edge TEOS delivery apertures 2006 is between 45 and 60 percent larger than an average diameter of the central TEOS delivery apertures 2008.

Figure 3:
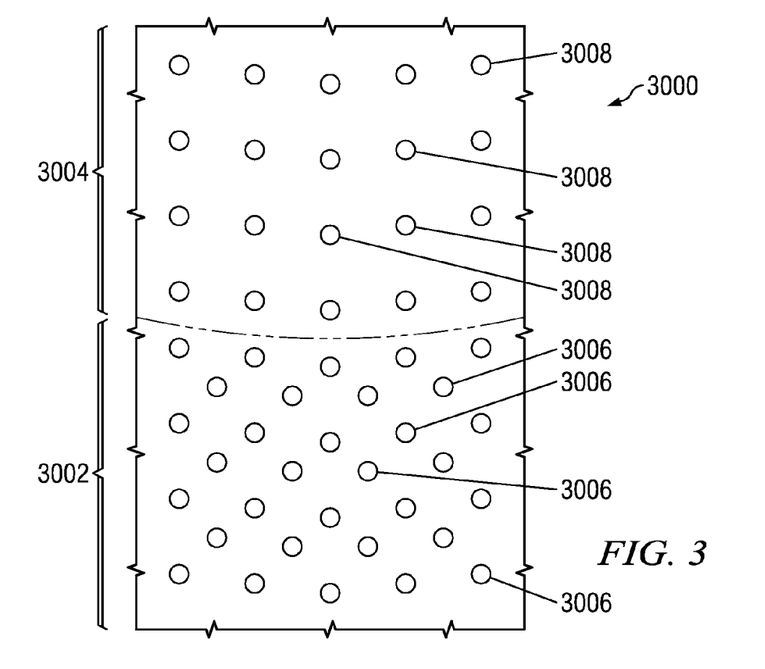
FIG. 3 is a plan view of a portion of a TEOS delivery showerhead formed according to another embodiment.

FIG. 3 is a plan view of a portion of a TEOS delivery showerhead formed according to another embodiment. The showerhead 3000 includes an edge band 3002 and a central region 3004 as described in reference to FIG. 1A. The showerhead 3000 includes a set of edge TEOS delivery apertures 3006 in the edge band 3002, and a set of central TEOS delivery apertures 3008 in the central region 3004. In the instant embodiment, the edge TEOS delivery apertures 3006 are substantially circular and substantially equal in size to each other, and the central TEOS delivery apertures 3008 are substantially circular and substantially equal in size to each other and to the edge TEOS delivery apertures 3006. In the instant embodiment, an area density of the edge TEOS delivery apertures 3006 is at least twice an area density of the central TEOS delivery apertures 3008.

Figure 4:
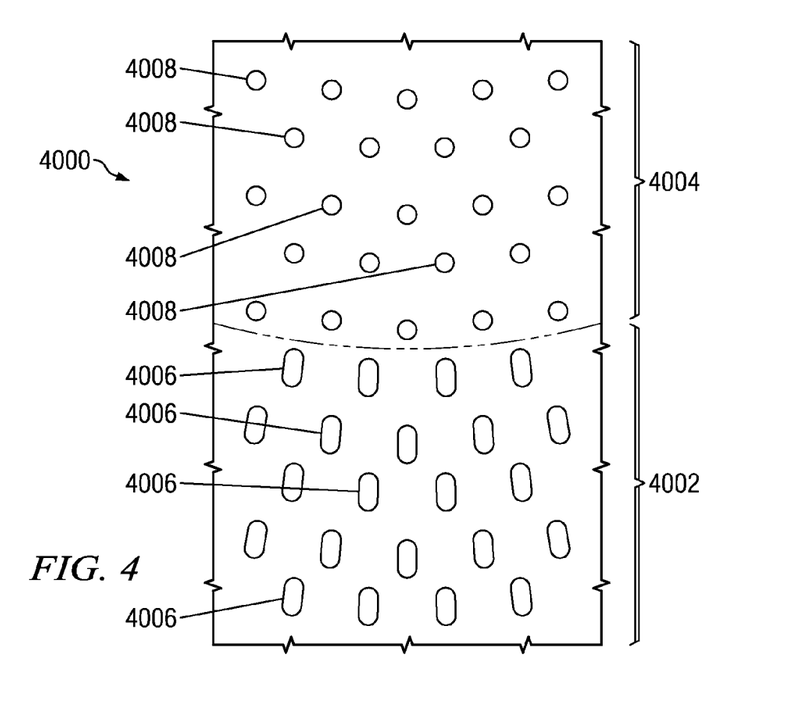
FIG. 4 is a plan view of a portion of a TEOS delivery showerhead formed according to a further embodiment.

FIG. 4 is a plan view of a portion of a TEOS delivery showerhead formed according to a further embodiment. The showerhead 4000 includes an edge band 4002 and a central region 4004 as described in reference to FIG. 1A. The showerhead 4000 includes a set of edge TEOS delivery apertures 4006 in the edge band 4002, and a set of central TEOS delivery apertures 4008 in the central region 4004. In the instant embodiment, an area density of the edge TEOS delivery apertures 4006 is substantially equal to an area density of the central TEOS delivery apertures 4008. In the instant embodiment, the edge TEOS delivery apertures 3006 are non-circular and substantially equal in size and shape to each other. The central TEOS delivery apertures 3008 are substantially circular and substantially equal in size to each other. An average area of an individual edge TEOS delivery aperture 4006 is at least twice an average area of an individual central TEOS delivery aperture 4008.

Figure 5:
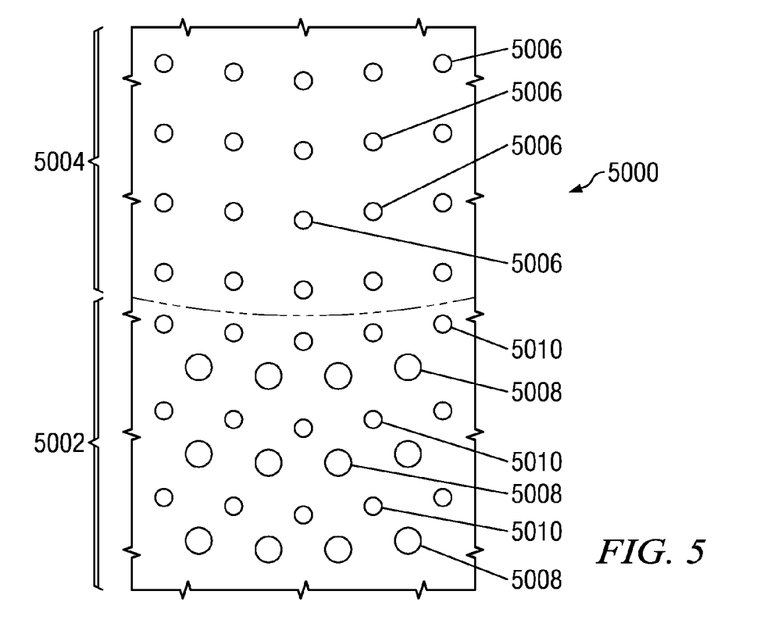
FIG. 5 is a plan view of a portion of a TEOS delivery showerhead formed according to another embodiment.

FIG. 5 is a plan view of a portion of a TEOS delivery showerhead formed according to another embodiment. The showerhead 5000 includes an edge band 5002 and a central region 5004 as described in reference to FIG. 1A. The showerhead 5000 includes a set of central TEOS delivery apertures 5006 in the central region 5004 which are substantially equal to each other in size and shape. In the instant embodiment, the showerhead 5000 includes a first set of first edge TEOS delivery apertures 5008 and a second set of second edge TEOS delivery apertures 5010 in the edge band 5002. An average area of an individual first edge TEOS delivery aperture 5008 is at 30 percent larger than an average area of an individual second central TEOS delivery aperture 5010. In the instant embodiment, a combined area percentage of the first edge TEOS delivery apertures 5008 and the second edge TEOS delivery apertures 5010, calculated by dividing a total area of the first edge TEOS delivery apertures 5008 and the second edge TEOS delivery apertures 5010 by an area of the edge band 5002, and expressed as a percentage, is at least twice an area percentage of the central TEOS delivery apertures 5006.

Figure 6:
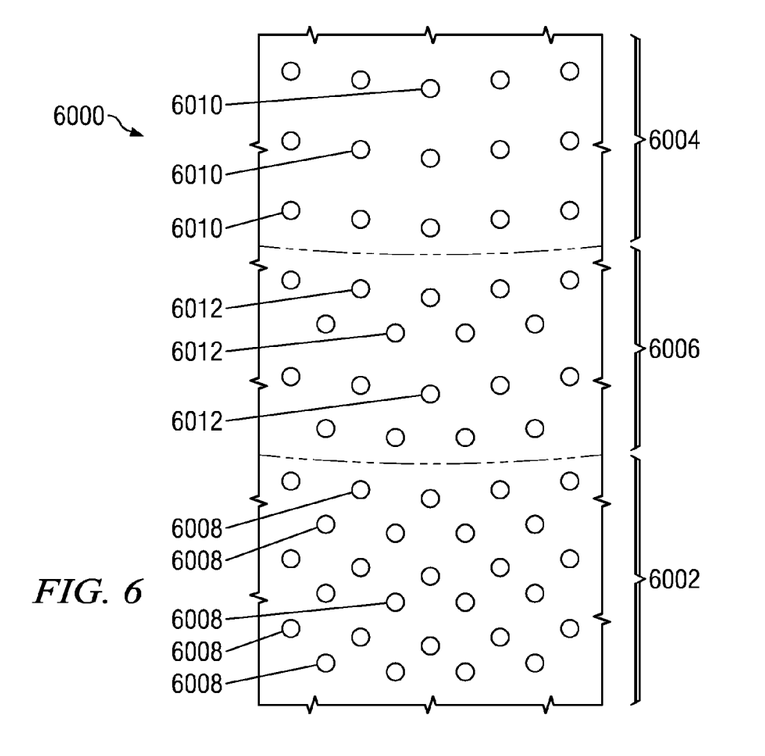
FIG. 6 is a plan view of a portion of a TEOS delivery showerhead formed according to another embodiment.

FIG. 6 is a plan view of a portion of a TEOS delivery showerhead formed according to another embodiment. The showerhead 6000 includes an edge band 6002 as described in reference to FIG. 1A. The showerhead 6000 also includes a central region 6004 which is separated from the edge band 6002 by a transition band 6006. The transition band 6006 may be, for example, half as wide as the edge band 6002. The showerhead 6000 includes a set of edge TEOS delivery apertures 6008 in the edge band 6002, a set of central TEOS delivery apertures 6010 in the central region 6004, and a set of transition TEOS delivery apertures 6012 in the transition band 6006. An area percentage of the edge TEOS delivery apertures 6008 is at least twice an area percentage of the central TEOS delivery apertures 6010. An area percentage of the transition TEOS delivery apertures 6012 is between the area percentage of the edge TEOS delivery apertures 6008 and the area percentage of the central TEOS delivery apertures 6010. In one embodiment, for example, the area percentage of the transition TEOS delivery apertures 6012 may be between 30 percent and 70 percent of an average of the area percentage of the edge TEOS delivery apertures 6008 and the area percentage of the central TEOS delivery apertures 6010.

It will be recognized that a TEOS delivery showerhead may be formed which has features of any combination of the embodiments discussed in reference to FIG. 2 through FIG. 6. For example, a central region of the showerhead may include TEOS delivery apertures of different sizes and/or shapes. An edge band of the showerhead may include three sets of TEOS delivery apertures of different sizes, shapes and/or area densities.

Figure 7:
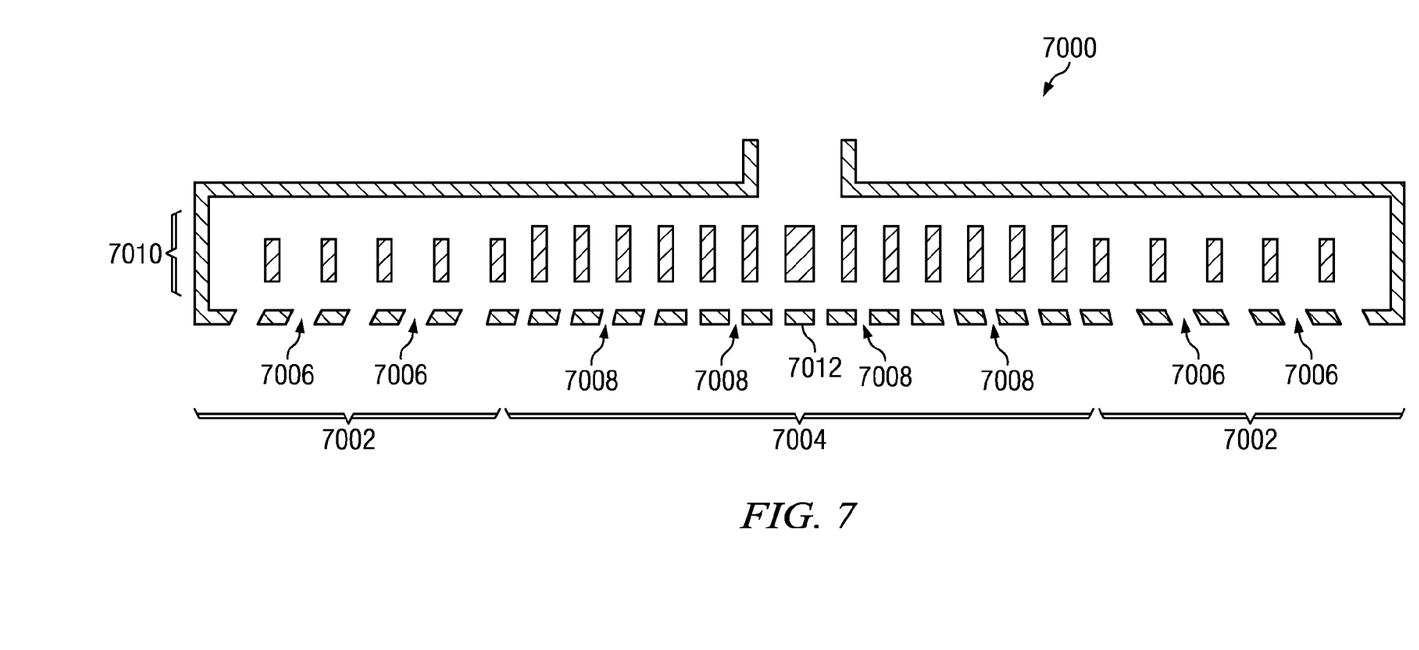
FIG. 7 is a cross section of a TEOS delivery showerhead formed according to an alternate embodiment.

FIG. 7 is a cross section of a TEOS delivery showerhead formed according to an alternate embodiment. The showerhead 7000 includes an edge band 7002 and a central region 7004 as described in reference to FIG. 1A. The showerhead 7000 includes a set of edge TEOS delivery apertures 7006 in the edge band 7002, and a set of central TEOS delivery apertures 7008 in the central region 7004. An interior region of the showerhead may include a diffuser 7010 which delivers an average flow rate per unit area at the edge band 7002 of the showerhead 7000 which is at least twice an average flow rate in the central region 7004. The edge TEOS delivery apertures 7006 may be slanted outward so as to deliver TEOS gas at an angle less than 90 degrees from a perpendicular to a bottom face 7012 of the showerhead 7000.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising steps:

disposing a wafer containing said integrated circuit in a dielectric deposition tool under a TEOS delivery showerhead of said dielectric deposition tool, said showerhead including:

an input port, said input port configured to receive TEOS gas;

an interior region connected to said input port, said interior region configured to distribute said TEOS gas; and a bottom plate abutting said interior region, said bottom plate including an edge band and a central region, such that:

said edge band extends from an outer edge of said bottom plate at least one half an inch and up to one fourth of a diameter of said wafer;

said bottom plate includes a set of edge TEOS delivery apertures in said edge band, said edge TEOS delivery apertures being configured to deliver said TEOS gas from said interior region to said wafer;

said bottom plate includes a set of central TEOS delivery apertures in said central region, said central TEOS delivery apertures being configured to deliver said TEOS gas from said interior region to said wafer; and so that an area percentage of said edge TEOS delivery apertures is at least twice an area percentage of said central TEOS delivery apertures, in which:

said area percentage of said edge TEOS delivery apertures is calculated by dividing a total area of said edge TEOS delivery apertures by an area of said edge band; and said area percentage of said central TEOS delivery apertures is calculated by dividing a total area of said central TEOS delivery apertures by an area of said central region;

forming a layer of silicon dioxide on a top surface of said wafer by providing TEOS gas to said input port, so that:

an average flow rate per unit area of said TEOS gas from said edge band of said showerhead is at least twice an average flow rate per unit area of said TEOS gas from said central region of said showerhead; and said silicon dioxide layer is thicker in a wafer outer annulus under said edge band of said showerhead than in a wafer core under said central region of said showerhead;

planarizing said silicon dioxide layer using a chemical mechanical polish (CMP) process, so that a thickness difference between an average thickness in said wafer outer annulus and an average thickness in said wafer core after completion of said CMP process is less than half a thickness difference between an average thickness in said wafer outer annulus and an average thickness in said wafer core after formation of said silicon dioxide layer and before said CMP process.

2. The process of claim 1, in which an average area of an instance of said edge TEOS delivery apertures is at least twice an average area of an instance of said central TEOS delivery apertures.

3. The process of claim 2, in which:
said edge TEOS delivery apertures are substantially circular and substantially equal in size to each other;
said central TEOS delivery apertures are substantially circular and substantially equal in size to each other; and
an average diameter of said edge TEOS delivery apertures is between 45 and 60 percent larger than an average diameter of said central TEOS delivery apertures.

4. The process of claim 2, in which said edge TEOS delivery apertures are non-circular and substantially equal in size and shape to each other.

5. The process of claim 1, in which:
said edge TEOS delivery apertures are substantially circular and substantially equal in size to each other;
said central TEOS delivery apertures are substantially circular and substantially equal in size to each other; and
an area density of said edge TEOS delivery apertures is at least twice an area density of said central TEOS delivery apertures, in which:
said area density of said edge TEOS delivery apertures is calculated by dividing a total number of said edge TEOS delivery apertures by an area of said edge band; and
said area density of said central TEOS delivery apertures is calculated by dividing a total number of said central TEOS delivery apertures by an area of said central region.

6. The process of claim 1, in which said interior region of said showerhead includes a diffuser which delivers an average flow rate of TEOS gas per unit area at said edge band which is at least twice an average flow rate of TEOS gas in said central region.

7. The process of claim 1, in which:
said showerhead is configured to deliver TEOS gas to a 200 mm wafer; and
a flow rate of said TEOS gas is such as provided by a flow rate of TEOS in liquid phase between 2.1 and 3.2 cubic centimeters per minute.

8. The process of claim 1, in which said showerhead is configured to deliver TEOS gas to a 300 mm wafer.

9. The process of claim 1, in which an average thickness of said silicon dioxide layer under said edge band is between 3 and 5 percent more than an average thickness of said silicon dioxide layer under said central region after formation of said silicon dioxide layer and before said CMP process.

10. The process of claim 1, in which said silicon dioxide layer has a compressive stress between 125 and 225 megapascals (MPa).

* * * * *